United States Patent [19]

Keeley et al.

[11] Patent Number: 4,990,374
[45] Date of Patent: Feb. 5, 1991

[54] SELECTIVE AREA CHEMICAL VAPOR DEPOSITION

[75] Inventors: Joseph T. Keeley, Woburn; Jitendra S. Goela, Andover; Michael A. Pickering, Dracut; Raymond L. Taylor, Saugus, all of Mass.

[73] Assignee: CVD Incorporated, Woburn, Mass.

[21] Appl. No.: 442,263

[22] Filed: Nov. 28, 1989

[51] Int. Cl.⁵ .............................................. C23C 16/00
[52] U.S. Cl. .............................. 427/255.1; 427/248.1; 118/715; 118/725
[58] Field of Search ............................... 118/715, 725; 427/248.1, 255.1

[56] References Cited

U.S. PATENT DOCUMENTS

| | | | |
|---|---|---|---|
| 4,033,286 | 7/1977 | Chern | 118/725 |
| 4,825,809 | 5/1989 | Mieno | 118/725 |
| 4,870,923 | 10/1989 | Sugimoto | 118/725 |

Primary Examiner—Richard Bueker
Attorney, Agent, or Firm—Gerald K. White

[57] ABSTRACT

A fluid dynamic method and apparatus effects the isolation of a predetermined deposition area in a hot-walled chemical vapor deposition chamber and limits the deposition to that area. The disclosed technique reduces stress and cracking in materials produced by chemical vapor deposition, prevents backside growth, and has particular utility in the fabrication by the chemical vapor deposition process of large, lightweight mirrors.

16 Claims, 2 Drawing Sheets

SELECTIVE AREA CHEMICAL VAPOR DEPOSITION

This invention was made with Government support under Contract No. F 33615-87-C-5227 awarded by the Air Force. The Government has certain rights in this invention.

BACKGROUND OF THE INVENTION

1. Field of the Invention

This invention relates to the selective deposition of material in a specific area of a vapor deposition system.

2. Description of the Prior Art

In chemical vapor deposition of ceramic materials, gases are introduced into a hot furnace where they react at the walls of the furnace or at the surface of a substrate or mandrel positioned in the furnace to form a solid deposit or coating thereon. In the formation of a coating of a ceramic material such as silicon carbide (SiC), methyltrichlorosilane ($CH_3SiCl_3$), hydrogen ($H_2$) and argon (Ar) gases are introduced into the reaction chamber through stainless steel injectors. Since methyltrichlorosilane (for convenience termed "MTS" hereinafter) is a liquid at room temperature, Ar is bubbled through the MTS and carries MTS vapor above the liquid to the injectors. Unreacted gases are evacuated from the furnace and cleaned in a gas scrubber. Thick deposits of SiC can be made. Typical conditions for the deposition of SiC are:

| | | |
|---|---|---|
| Substrate Temperature | | 1300° C. |
| Furnace or reaction chamber pressure | | 200 torr |
| Partial pressure of gases | Ar | 68 torr |
| | $H_2$ | 102 torr |
| | MTS | 30 torr |

A process is disclosed in application Ser. No. 389,248 filed Aug. 3, 1989 by *J. S. Goela, M. A. Pickering* and R. L. Taylor and assigned to the assignee of the present invention for fabricating, by vapor deposition, lightweight structures out of refractory materials. The methods and lightweight structures disclosed in that application, which application by reference is incorporated herein, involve a core to define the shape and size of each structure. The core is coated with an appropriate deposit, such as silicon carbide (SiC) or silicon (Si), to give the structure strength and stiffness and for bonding thereof to another surface, for example, the surface of a substrate comprising the faceplate of a mirror being fabricated.

In the fabrication of mirrors, graphite may be used to form a mandrel for replicating on a SiC faceplate. One side of the mandrel is optically fabricated, either as flat or as a convex spherical shape. The other side of the mandrel is lapped flat. The lapped side of the mandrel is bonded by means of pillars and graphite cement to a baffle plate in a vapor deposition reactor. The mandrel is then coated with multiple coats of a suspension of carbon in solvent, following which the surface of the mandrel is buffed or polished to make it as shiny as possible without significantly altering its figure. Deposition of SiC on the mandrel is then effected. Without separating the faceplate from the mandrel, the exposed SiC surface may be etched with hot potassium hydroxide (KOH) to improve bonding of graphite to SiC. A lightweight structure core is then fabricated from flat or curved graphite ribs, as disclosed in the aforementioned Goela et al. application for patent. After being bonded together with graphite cement, the lightweight structure core is bonded with graphite cement to the etched SiC surface of the mandrel. SiC is then deposited to enclose the lightweight structure core following which the baffle plate is separated from the baffle pillars. Controlled edging may be performed to remove excess SiC deposit. Using a blade, the interface between the graphite mandrel and the SiC faceplate may then be opened to recover the SiC coated mirror faceplate. The latter is then ready for Si coating.

Selective deposit to confine Si growth to only the front face of the SiC coated faceplate in the fabrication of the mirror surface is very important. This is for the reason that cracks tending to propagate from the wall of the furnace to the mirror faceplate or other substrate and growth on the backside thereof are disadvantageous. In each case, if not prevented, cracking of the deposit on the front side often results, making replication in a chemical vapor deposition system difficult to achieve, and additionally, requiring post deposition machining to separate the substrate-deposit from the deposition fixture.

Efforts in the prior art to overcome the problem of cracks propagating from the wall of the furnace to the mirror faceplate or other substrate have been unsatisfactory, involving reducing the amount of material deposited around a predetermined selected area in order to isolate the area.

A masking method involving a hollow body made of flexible graphite is disclosed in application Ser. No. 403,957 filed Sept. 7, 1989 by J. S. Goela, R. D. Jaworski and R. L. Taylor, now Pat. No. 4,963,393 for preventing backside growth on faceplates in the fabrication of mirrors in a vapor deposition system.

SUMMARY OF THE INVENTION

An object of the invention is to provide an improved method of and apparatus for effecting the isolation of a predetermined deposition area in a hot-walled chemical vapor deposition chamber.

Another object of the invention is to provide an improved method of an apparatus for holding a mirror faceplate or other substrate in a hot-walled chemical vapor deposition chamber in a stress-free state with the substrate isolated from the deposition chamber wall.

An additional object of the invention is to provide a method of isolating a predetermined area in a hot-walled chemical vapor deposition chamber, which area comprises the surface area of a substrate that is positioned in the chamber and on which a coating of a chemical vapor deposition material is to be deposited, comprising the steps of:

(a) surrounding the said area by a suitably supported ring having an inner wall that matches the shape of the said area except for a narrow annular space that separates the inner wall of the ring from the boundary or peripheral edge of the said area, and (b) establishing a flow of nonreactive gas through the annular space in a direction substantially in opposition to the direction of flow of the chemical vapor deposition material in the chemical vapor deposition chamber, with the rate of flow of the nonreactive gas being such as to maintain a small pressure differential between the gas in the annular space and the gas in the chemical vapor deposition chamber.

A further object of the invention is to provide an apparatus for effecting the isolation of a predetermined deposition area in a hot-walled chemical vapor deposition chamber, comprising:

first means establishing the predetermined deposition area in the chemical vapor deposition chamber, said area having a boundary, a ring enclosing the predetermined deposition area with a substantially uniform annular space separating the boundary of the predetermined deposition area from the inner wall of the ring, second means for establishing a flow of chemically vapor deposition material in said chamber, and third means for establishing a flow of nonreactive gas through the annular space in a direction substantially opposite to the flow of chemically vapor deposition material in said chamber.

In accomplishing these and other objectives of the invention, an appropriate mirror faceplate or other substrate which may be of any shape (hexagonal, square, triangular, circular, etc.) and size is taken and mounted, in a manner designed to minimize stress on the substrate during the chemical vapor deposition process, on: (1) a sufficient number of support pillars or posts made of graphite or any other suitable material, or (2) graphite felt or any other suitable porous material. The substrate is enclosed by a ring which matches the shape of the substrate. The ring can be made from graphite or any other suitable material. The annular space between the peripheral edge or boundary of the substrate and the inner wall of the ring is narrow, being a few millimeters, that is, in a range of one to two millimeters. An inert gas, such as argon, is flowed from beneath the substrate. This flow isolates the substrate from the rest of the furnace or deposition chamber and prevents growth between the substrate and the ring. A flow rate of gas is used which will maintain a small pressure differential in a range of one to ten torr between the gas in the ring and the gas in the furnace. By isolating the substrate from the rest of the furnace, cracks propagating from the wall of the furnace to the substrate are eliminated. Backside growth on the substrate which often results in cracking of the deposit is also prevented.

By this method and means, there is enabled the achievement of good figure replication in the fabrication of mirrors. In order to obtain this result, both the SiC mandrel or substrate and the replicas must be held in a stress-free state and isolated from the internal graphite set-up (deposition zone) of the chemical vapor deposition chamber.

The various features of novelty which characterize the invention are pointed out with particularity in the claims annexed to and forming a part of the specification. For a better understanding of the invention, its operating advantages, and specific objects attained by its use, reference is made to the accompanying drawings and descriptive matter in which a preferred embodiment of the invention is illustrated.

BRIEF DESCRIPTION OF THE DRAWINGS

With this description of the invention, a detailed description follows with reference being made to the accompanying drawings which form part of the specification wherein.

DESCRIPTION OF THE PREFERRED EMBODIMENT

Figure 1:
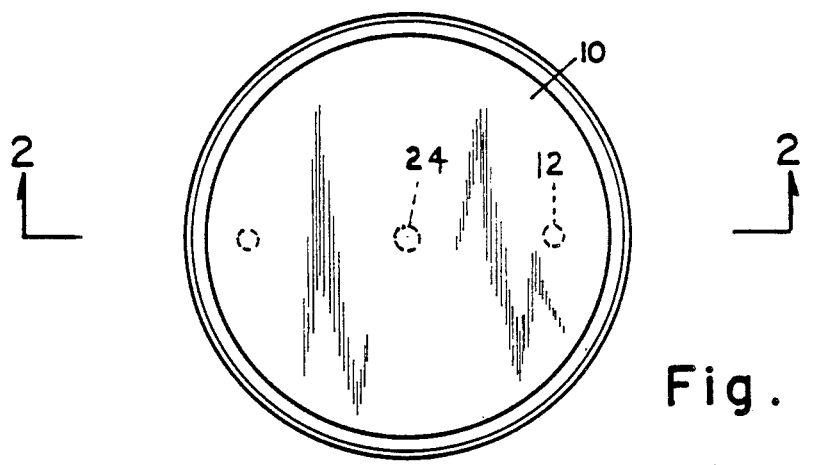
FIG. 1 is a top plan view of a structure for providing a gas shroud to isolate a predetermined area such as the surface of a mirror faceplate or other substrate in a chemical vapor deposition system thereby to enable the selective deposit thereon of a ceramic material.
Figure 2:
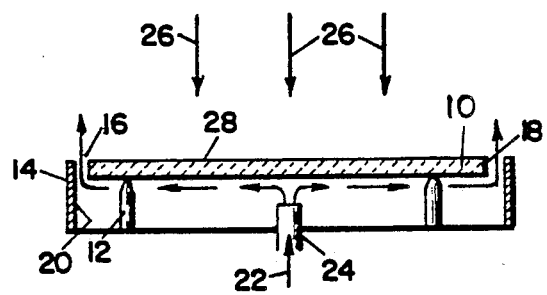
FIG. 2 is a cross sectional view of the structure of FIG. 1 taken along the lines 2—2.

In FIGS. 1 and 2 of the drawings a circular substrate 10 is shown mounted on a plurality of spaced support pillars 12 which may be made of graphite or any other suitable material. The pillars 12 are bonded with a suitable bonding agent to the substrate 10 and are mounted on and supported by a baffle plate (not shown) but provided in the deposition chamber of a chemical vapor deposition system such as that illustrated in FIG. 5.

The substrate 10, which may comprise the faceplate of a mirror being fabricated, is enclosed by an outer ring 14. The ring 14 is supported by suitable means (not shown) and matches the shape of the substrate with a narrow substantially uniform annular space 16 having a width of between one and two millimeters separating the peripheral edge 18 of the substrate 10 from the inner wall 20 of the ring 14. The ring 14 may be made of graphite or any other suitable material.

As indicated by the upwardly directed arrow 22, an inert or nonreactive gas, such as argon, flows upward from beneath the ring 14 from a suitable source (not shown) through a flow line 24. The upward flow of argon impinges on the lower side of the substrate 10. The upward flow of argon continues through the annular space 16 between the substrate 10 and the ring 14 and prevents the deposit and thereby any growth of chemically vapor deposited material between the substrate 10 and ring 14, the flow of chemically vapor deposited material being indicated by the downwardly directed arrows 26. A flow rate of argon is used which will maintain a small difference between the pressure, $P_R$, in the annular space 16 and the gas pressure, $P_F$, in the vapor deposition chamber of the chemical vapor deposition system. As a result, chemical vapor deposited material is precluded from flowing into the annular space 16 between the substrate 10 and the ring 14. This effectively isolates the substrate 10 from the rest of the vapor deposition chamber. By isolating the substrate 10 from the rest of the deposition chamber, cracks tending to propagate from the wall of the vapor deposition chamber to the substrate 10 are eliminated. Backside growth on the substrate 10 is also prevented. Such growth often results in cracking of the desired deposit on the opposite or front side 28 of the substrate 10.

Figure 3:
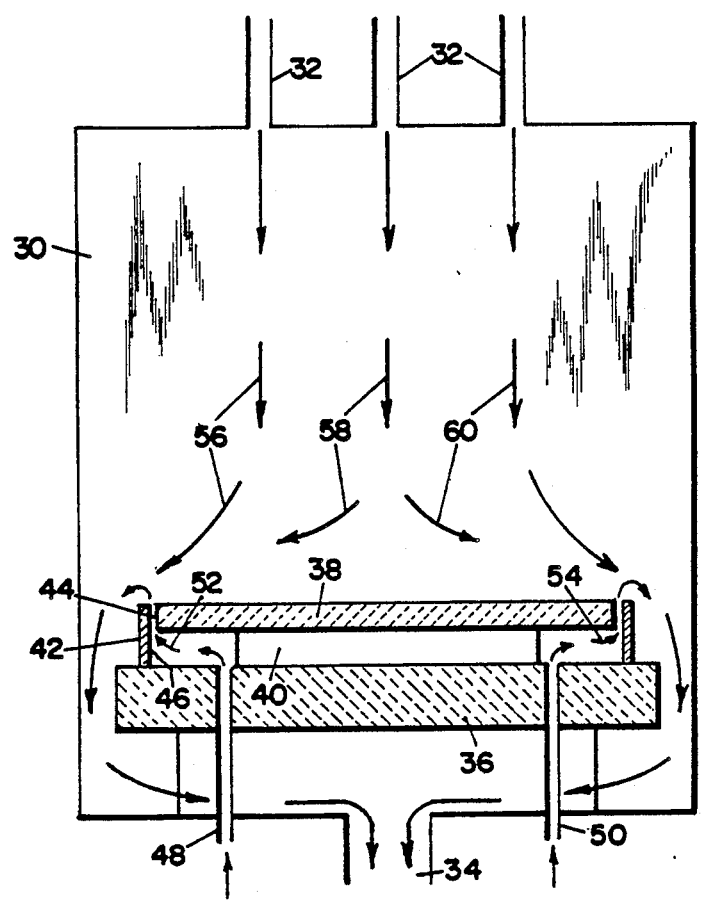
FIG. 3 is a schematic illustration of a chemical vapor deposition chamber including injectors at the upper end for the introduction of reactive gases and an opening or port at the lower end for drawing off or exhausting nonreacted gases, and containing therein a baffle plate on which is mounted a modification of the structure shown in FIGS. 1 and 2 for enabling the selective deposit of a ceramic material on a predetermined area.

In FIG. 3 there is schematically illustrated a chemical vapor deposition chamber 30 including injectors 32 at the upper end, as seen in the drawing, for the introduction of reactive gases and an opening or port 34 at the lower end for exhausting nonreacted gases. Mounted on a baffle plate 36, which is supported in chamber 30 by suitable means (not shown) adjacent the port 34, is a modified structure for enabling the selective deposit of a chemically vapor deposited material on the surface of a substrate 38. The substrate 38 is mounted on the baffle plate 36 by means of a suitable support post 40 and is enclosed by an outer ring 42. Ring 42 matches the shape of the substrate 38. A narrow substantially uniform annular space 44 having a width of between one and two millimeters separates the peripheral edge of the substrate 38 from the inner wall 46 of ring 42. The ring 42 may be made of graphite, and as shown, rests on and is supported by the baffle plate 36.

Flow lines 48 and 50, which extend through the chamber 30 and the baffle plate 36 from a source (not shown) of an inert or nonreactive gas such as argon, provide an upward flow of such gas indicated by arrows 52 and 54, through the annular space 44. The upward flow of gas through the annular space 44 prevents the deposit of chemically vapor deposited material, indicated by arrows 56, 58 and 60, between the substrate 38 and ring 42. This isolates the substrate 38 from the rest of the chemical vapor deposition chamber 30 to provide advantageous results similar to those described in connection with FIGS. 1 and 2. A flow rate of argon is used which will maintain a small differential in the pressures, $P_R$, in the annular ring, and $P_F$, in the chamber 30.

Figure 4:
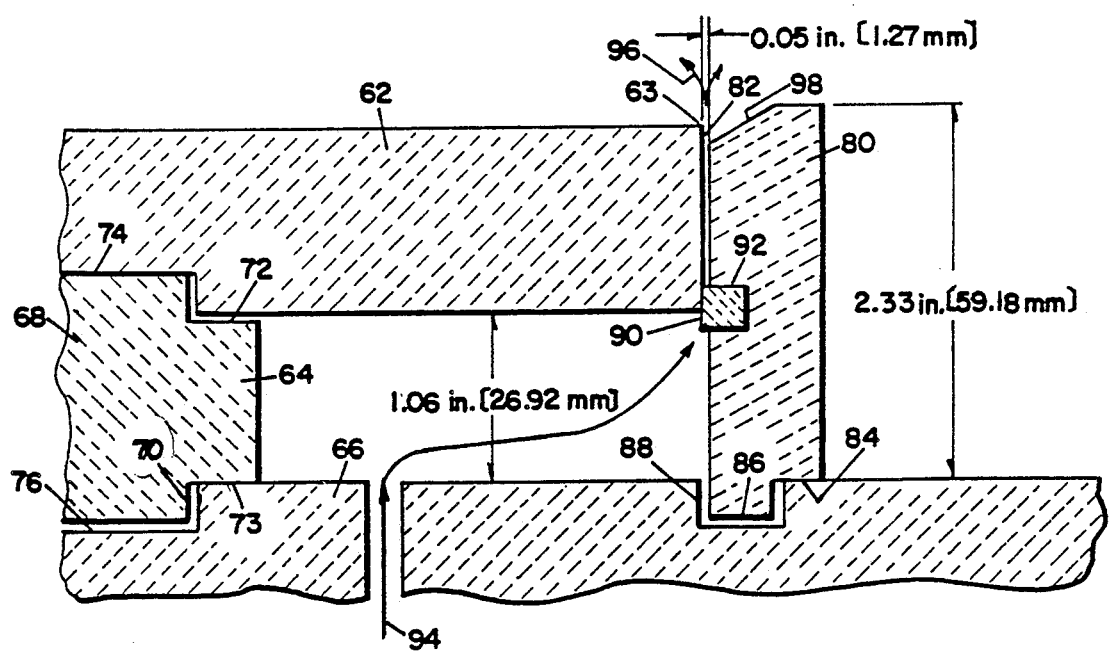
FIG. 4 is a fragmented cross sectional view illustrating a modification of the structure shown in FIG. 3, which modification is characterized by the ability thereof to support in a stress-free manner a mirror faceplate or other substrate that is mounted on the baffle plate.

FIG. 4 is a fragmented cross sectional view illustrating a modification of the structure shown in FIG. 3 for supporting a mirror faceplate or other substrate in a stress-free manner. In FIG. 4 a substrate 62 is shown mounted on a support post 64 which is positioned between the substrate 62 and a baffle plate 66. While one support post 64 only is shown in FIG. 4, those skilled in the art will understand that several such support posts may be utilized, particularly in the fabrication of larger diameter mirrors (0.5 m. or greater).

The support post 64 includes opposed end portions 68 and 70 of reduced cross section thus providing respectively associated adjacent shoulders 72 and 73. The end portion 68 of post 64 is received in an individually associated cavity 74 provided on the substrate 62. Similarly, the portion 70 is received in an individually associated cavity 76 provided in the baffle plate 66. Cavity 76, as shown, is positioned in substantial alignment with the cavity 74 in substrate 62. The relative dimensions of the end portions 68 and 70 and the cavities 72 and 74 are such that the post 64 is movable laterally a few millimeters relatively to both the substrate 62 and the baffle plate 66.

As shown in the drawing, the length of the end portion 68 of post 64 is longer than the end portion 70. Additionally, the depth of the cavity 74 in the substrate 62 is less than that of the cavity 76 in the baffle plate 66. With this arrangement, the end portion 68 of post 64 is in direct supporting contact with the substrate 62 at the inner end of cavity 74 and the shoulder 73 of the post 64 is in direct supporting contact with the baffle plate 66. As a consequence, stresses tending to be induced in the substrate 62 upon changes in temperature within the deposition chamber, particularly upon cool down of the substrate 62 from the high temperatures required for chemical vapor deposition, is substantially minimized. Thus, the mounting for the substrate 62 is substantially stress-free.

Also, as shown in the drawing, the substrate is enclosed by a ring 80. Ring 80 matches the shape of the substrate 62, being separated from the peripheral edge 63 thereof by a substantially uniform annular space 82 having a width in the range of one to two millimeters. The ring 80 may be made of graphite, and as shown, rests on and is supported by the baffle plate 66. More specifically, a shoulder 84 provided adjacent a first end portion, specifically the bottom end of ring 80, as seen in the drawing, rests on the baffle plate 66, with an end portion 86 at the first end of the ring extending into a circular groove 88 provided in the baffle plate 66. The width of the circular groove 88 is sufficiently greater than the width of the end portion 86 of ring 80 that the latter is movable laterally a few millimeters relatively to the baffle plate 66.

For insuring the maintenance of a substantially uniform width of the annular space 82 between the peripheral edge 63 of the substrate 62 and the inner wall of the ring 80, a suitable spacer ring 90 is provided, as shown, between the peripheral edge 63 of the substrate 62 and the inner wall of the ring. The spacer ring 90 may be made of porous graphite or other suitable porous material and desirably is embedded in a circular groove 92 provided in the wall of the ring 90, as shown.

A flow line 94 extends through the baffle plate 66 from a source (not shown) of an inert or nonreactive gas such as argon to provide an upward flow of such gas, as indicated by the arrow 96 through the porous spacer ring 90 and the annular space 82 between the substrate 62 and the ring 80. A flow line (not shown) similar to the flow line 94 preferably is also provided through the baffle plate 66 on the other side of the support post 64.

For facilitating the deposit of chemically vapor deposited material to the peripheral edge 63 of the surface of the substrate 62, the inner upper or second end of ring 80, as seen in the drawing, is cut away to provide a chamfered surface 98. This chamfered surface 98 precludes bridging of the annular space 82 by the chemical vapor deposition material being deposited. Such bridging would be detrimental in that it would destroy the isolation of the substrate 62 from the chemical vapor deposition chamber. Thus, extension of the coating being deposited to the peripheral edge 63 of the substrate 62 is made possible. The momentum of the upward flow of gas through the annular space 82 is such that little or no outward flaring of the gas results.

Figure 5:
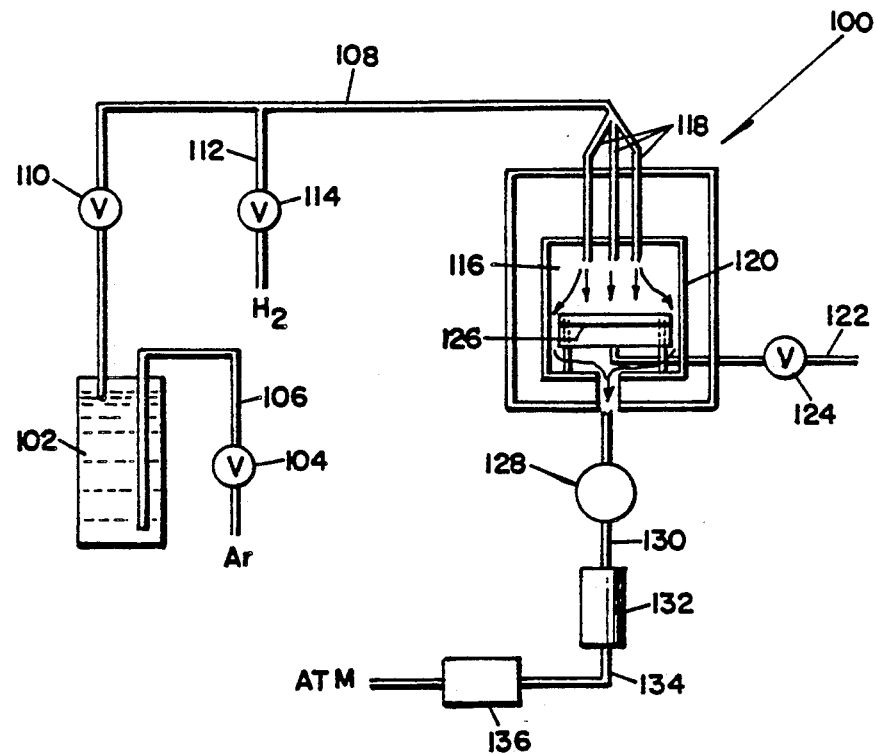
FIG. 5 is a schematic illustration of an impinging chemical vapor deposition system in which the chemical vapor deposition chamber and structures of FIG. 3 and 4 may be incorporated.

FIG. 5 is a schematic illustration of a chemical vapor deposition system 100 that may be used for the selective deposit of SiC and Si on the substrates 10, 38 and 62 of FIGS. 1–4. As seen in FIG. 5, argon enters a bubbler chamber 102 from a suitable source (not shown) by way of a valve 104 and a flow line 106. Bubbler chamber 102 may contain MTS or trichlorosilane ($SiHCl_3$, hereinafter referred to as "TS"). MTS is preferred to produce a SiC deposit. TS is preferred to produce a Si deposit. As those skilled in the art will understand, however, other hydrocarbon and silane sources can be used to produce SiC and Si deposits. Both of these deposits have been fabricated over a wide range of deposition temperatures and reaction chamber pressures.

Argon bubbles carrying the reagent MTS or TS enter a flow line 108 under the control of a valve 110. Hydrogen enters the flow line 108 through a flow line 112 from a suitable source (not shown) under the control of a valve 114. The reagents may be introduced into a reaction chamber 116 of the chemical vapor deposition system 100 through injectors 118 that may be identical to the injectors 32 shown in FIG. 3.

Reaction chamber 116 may be a conventional ceramic deposition chamber and is contained within a reaction zone tube 120. Reaction chamber 116 may be heated to a temperature in the range between about 830° C. and 1350° C. by suitable heating elements (not shown).

Argon also enters the reaction chamber 116 through a flow line 122 from a suitable source (not shown), which source may be the same as that from which argon flows to the bubbler chamber 102. The flow of argon in the flow line is controlled by a valve 124. This flow of argon is operative, as described in connection with FIGS. 1-4, to effect the isolation of a predetermined deposition area in which the surface of a substrate 126 is positioned from the rest of the reaction chamber 116.

Gaseous products are removed from the reaction chamber 116 through a filter 128 through a flow line 130 to a vacuum pump 132. From the vacuum pump, the gases are conveyed through a flow line 134 to a scrubber 136. The scrubbed gases are then vented to the atmosphere.

Thus, in accordance with the invention, there has been provided an improved method of and apparatus for effecting the isolation of a predetermined deposition area in a hot-walled chemical vapor deposition chamber, to which area the chemical vapor deposition is limited, and for holding a mirror faceplate or other substrate in a stress-free state in such isolated predetermined isolation area.

With this description of the invention in detail, those skilled in the art will appreciate that modifications may be made to the invention without departing from its spirit. Therefore, it is not intended that the scope of the invention be limited to the specific embodiments illustrated and described. Rather, it is intended that the scope of the invention be determined by the appended claims and their equivalents.

What is claimed is:

1. A method of isolating a predetermined area in a hot-walled chemical vapor deposition chamber, which area comprises the surface area of a substrate that is positioned in the chamber and on which a coating of a chemical vapor deposition material is to be deposited, comprising the steps of:
   (a) surrounding the said area by a suitably supported ring having an inner wall that matches the shape of the said area and thereby of the surface area of the substrate except for a narrow annular space that separates the inner wall of the ring from the boundary of the said area, and
   (b) establishing a flow of nonreactive gas through the annular space in a direction substantially in opposition to the direction of flow of the chemical vapor deposition material in the chemical vapor deposition chamber, with the rate of flow of the nonreactive gas being such as to maintain a small pressure differential between the gas in the annular space and the gas in the chemical vapor deposition chamber.

2. A method as defined by claim 1 wherein the boundary of the surface area of the substrate is circular and the ring is in the form of a cylinder.

3. A method as defined by claim 1 wherein the width of the annular space is substantially uniform around the boundary of the predetermined area.

4. A method as defined by claim 3 wherein the width of the annular space is a few millimeters.

5. A method as defined by claim 3 wherein the width of the annular space is in the range of one millimeter to two millimeters.

6. A method as defined by claim 1 wherein the nonreactive gas is argon.

7. A method as defined by claim 1 wherein the boundary of the surface area of the substrate is circular and the ring is in the form of a cylinder,
   wherein the width of the annular space that separates the inner wall of the ring from the boundary of the predetermined area is substantially uniform and is in the range of one to two millimeters, and
   wherein the nonreactive gas is argon.

8. Apparatus for effecting the isolation of a predetermined deposition area in a hot-walled chemical vapor deposition chamber, comprising:
   first means for establishing the predetermined deposition area in the chemical vapor deposition chamber, said area having a boundary,
   a ring enclosing the predetermined deposition area with a substantially uniform annular space separating the boundary of the predetermined deposition area from the inner wall of the ring,
   second means for establishing a flow of chemically vapor deposition material in said chamber, and
   third means for establishing a flow of nonreactive gas through said annular space in a direction substantially opposite to the flow of chemically vapor deposition material in said chamber.

9. Apparatus as defined by claim 8 wherein said first means includes a substrate having a surface area defined by a peripheral edge, on which surface area a coating of chemical vapor deposition material is to be deposited, said substrate having an opposite side.

10. Apparatus as defined by claim 8 wherein said first means further includes a plurality of support pillars on which said substrate is mounted in said chemical vapor deposition chamber.

11. Apparatus as defined by claim 10 wherein said plurality of support pillars are made of graphite.

12. Apparatus as defined by claim 9 wherein said third means includes at least one flow line from which nonreactive gas impinges on the side of the substrate opposite to the surface area on which a coating of chemical vapor deposited material is to be deposited.

13. Apparatus as defined by claim 8 wherein said first means includes a substrate having a surface area on which a coating of chemical vapor deposition material is to be deposited and having an opposite side,
   wherein said first means further includes a plurality of support pillars on which said substrate is mounted in said chemical vapor deposition chamber,
   wherein said pillars are made of graphite,
   wherein said ring is made of graphite, and
   wherein said third means includes at least one flow line from which nonreactive gas impinges on the side of the substrate opposite to the surface area on which a coating of chemical vapor deposited material is to be deposited.

14. Apparatus as defined by claim 9 wherein said first means further includes a baffle plate that is suitably supported in the chemical vapor deposition chamber and at least one support post positioned between the substrate and the baffle plate on which said substrate is mounted, wherein said support post includes opposed end portions of reduced cross section and a shoulder associated with each end portion, wherein said baffle plate and the opposite side of said substrate includes aligned cavities into which an individually associated one of the opposed end portions of said support post is received, with the cavity in said baffle plate having a depth greater than the cavity in the substrate and the end portion of said post associated with said substrate having a length greater than the end portion associated with said baffle plate whereby said substrate is in direct contact at the inner end of the cavity therein with the associated end of said post and said baffle plate is in direct contact with the shoulder associated with the end portion of said post that is received in the cavity thereof, with the relative dimensions of the opposed post end portions and the individually associated cavities being such that the post is movable laterally a few millimeters relatively to the substrate and the baffle plate, wherein said ring enclosing the predetermined deposition area has a wall having a portion of reduced thickness at a first end providing a shoulder thereat and encloses said substrate with an annular space having a substantially uniform width separating the peripheral edge of said substrate from the inner wall of said ring, further including a groove encircling the inner wall of said ring and a spacer means positioned in said groove for maintaining the uniformity of the width of said annular space, wherein said baffle plate includes a groove having a shape conforming to the cross section of said ring with the width of such groove being less than the thickness of the wall of said ring, and wherein said ring is supported on said baffle plate with said portion of reduced thickness at said first end extending part way only into said groove in said baffle plate and with the shoulder thereat in contact with the baffle plate, the relative widths of the said portion of reduced width of said ring and the width of said groove in said baffle plate being such as to allow lateral movement of said ring relatively to said baffle plate of a few millimeters, whereby stress tending to be induced in said substrate upon changes in temperature in said deposition chamber, particularly upon cool down from the high temperature required for chemical vapor deposition, is substantially minimized.

15. Apparatus as defined by claim 14 wherein said ring at the second end thereof is cut away at the inner side to provide a chamfered surface which precludes bridging of said annular space by chemical vapor deposition material and thus allows chemical vapor deposition material to be deposited on the surface of the substrate to the peripheral edge thereof.

16. Apparatus for effecting the isolation of a predetermined deposition area in a hot-walled chemical vapor deposition chamber, comprising:

first means for supporting the surface area of a substrate having a peripheral edge in the predetermined deposition area for the deposition thereon of a coating of chemical vapor deposited material, a ring enclosing the predetermined deposition area with a substantially uniform annular space separating the peripheral edge of the substrate from the inner wall of the ring, second means for establishing a flow of chemical vapor deposition material in said chamber, and third means for establishing a flow of nonreactive gas through the annular space in a direction opposite to the flow of chemical vapor deposition material in said chamber.

* * * * *